United States Patent
Yeung et al.

(10) Patent No.: US 7,646,083 B2
(45) Date of Patent: Jan. 12, 2010

(54) I/O CONNECTION SCHEME FOR QFN LEADFRAME AND PACKAGE STRUCTURES

(75) Inventors: Fan Yeung, Irvine, CA (US); Sam Ziqun Zhao, Irvine, CA (US); Nir Matalon, Sunnyvale, CA (US); Victor Fong, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/059,526

(22) Filed: Mar. 31, 2008

(65) Prior Publication Data

US 2009/0243054 A1    Oct. 1, 2009

(51) Int. Cl.
   *H01L 23/495*    (2006.01)
(52) U.S. Cl. ............... 257/670; 257/666; 257/672; 257/676; 257/E23.031; 257/E23.037
(58) Field of Classification Search ......... 257/666–667, 257/E23.031–E23.059, E21.505, 672
See application file for complete search history.

(56) References Cited

U.S. PATENT DOCUMENTS 5,723,899 A * 3/1998 Shin .......................... 257/666
6,583,499 B2 * 6/2003 Huang et al. ................. 257/666
7,279,780 B2   10/2007 Fee et al.

OTHER PUBLICATIONS

"Data Sheet: Leadframe CSP, High Performance, Cost Efficient", Amkor Technology, (Aug. 2007), 2 pages.
"AND8086/D Board Mounting Notes for Quad Flat-Pack No-Lead Package (QFN)", ON Semiconductor, (Aug. 2002), 4 pages.

* cited by examiner

*Primary Examiner*—Jasmine J Clark
(74) *Attorney, Agent, or Firm*—Fiala & Weaver P.L.L.C.

(57) ABSTRACT

Methods, systems, and apparatuses for integrated circuit packages and lead frames are provided. A quad flat no-lead (QFN) package includes a plurality of peripherally positioned pins, a die-attach paddle, an integrated circuit die, and an encapsulating material. The die-attach paddle is positioned within a periphery formed by the pins. The die is attached to the die-attach paddle. The encapsulating material encapsulates the die on the die-attach paddle, encapsulates bond wires connected between the die and the pins, and fills a space between the pins and the die-attach paddle. One or more of the pins are extended. An extended pin may be elongated, L shaped, T shaped, or "wishbone" shaped. The extended pin(s) enable wire bonding of additional ground, power, and I/O (input/output) pads of the die in a manner that does not significantly increase QFN package cost.

18 Claims, 8 Drawing Sheets

400

402 form a lead frame having a ring shaped outer frame, a plurality of leads extending inwardly from an inner edge of the ring shaped outer frame, and a die-attach paddle

404 mount an integrated circuit die to the die-attach paddle

406 attach at least one wire bond between the integrated circuit die and at least one lead of the plurality of leads

408 encapsulate the integrated circuit die and at least a portion of the lead frame

410 remove the ring shaped outer frame

FIG. 4 form a first lead to have a first portion that extends from the inner edge towards the die-attach paddle and a second portion that extends from an end of the first portion between the die-attach paddle and a second lead

I/O CONNECTION SCHEME FOR QFN LEADFRAME AND PACKAGE STRUCTURES

BACKGROUND OF THE INVENTION

1. Field of the Invention

The present invention relates to integrated circuit packaging technology and more particularly to quad flat no lead (QFN) packages.

2. Background Art

Integrated circuit (IC) chips or dies from semiconductor wafers are typically interfaced with other circuits using a package that can be attached to a printed circuit board (PCB). One such type of IC die package is a quad flat package (QFP). A QFP is a four sided package that has leads extending from all four sides. The leads are used to interface the QFP with a circuit board when the QFP is attached to the circuit board during a surface mount process.

A type of integrated circuit package that is similar to the QFP is a quad flat no lead (QFN) package. Similarly to a QFP, a QFN package has four sides, but does not have leads that extend outward from the sides of the package. Instead, a bottom surface of the QFN package has contacts/lands that may be referred to as "pins." The contact pins interface the QFN package with a circuit board when the QFN is attached to the circuit board during a surface mount process.

QFN packages are undergoing a rapid growth in their use in industry due to their advantages, such as small size, thin profile, low weight, and low cost. As products operate at increasingly higher speeds and require increasing amounts of power, a corresponding increase in the electrical capabilities of QFN packages will be required. Thus, what is needed are QFN packages having enhanced electrical capabilities.

BRIEF SUMMARY OF THE INVENTION

Methods, systems, and apparatuses for integrated circuit packages and processes for assembling the same, are provided. According to aspects of the present invention, a lead frame-based integrated circuit package is provided with extended pins. The extended pins enable enhanced electrical and/or mechanical functionality/capability for the lead frame-based integrated circuit package.

In a first aspect, a quad flat no-lead (QFN) package includes a plurality of peripherally positioned pins, a die-attach paddle, an integrated circuit die, and an encapsulating material. The die-attach paddle is positioned within a ring formed by the peripheral pins. The die is attached to the die-attach paddle. The encapsulating material encapsulates the die, bond wires connected between the die and the pins, and at least a portion of the pins. One or more of the pins are extended in shape.

An extended pin enables wire bonding of additional ground, power, and/or I/O (input/output) signals of the die in the QFN package relative to conventional pins. In some example configurations, an extended pin may have an elongated shape, an L shape, a T shape, or a "wishbone" shape, among other shapes.

In another aspect of the present invention, a lead frame for an integrated circuit package is provided. The lead frame includes a ring shaped outer frame, a plurality of leads extending inwardly from an inner edge of the ring shaped outer frame, and a die-attach paddle. The die-attach paddle is positioned within the ring shaped frame and is coupled to the ring shaped frame by at least one interconnect. An extended lead has a first portion and second portion. The first portion extends from the inner edge towards the die-attach paddle. The second portion extends from the first portion to between the die-attach paddle and a second lead.

The extended lead may optionally have an additional (e.g., third) portion and further portions. In some example configurations, the first lead may have an elongated shape, an L shape, a T shape, or a "wishbone" shape, among other shapes.

In another aspect of the present invention, a method for assembling a QFN package is provided. A lead frame is formed having a ring shaped outer frame, a plurality of leads extending inwardly from an inner edge of the ring shaped outer frame, and a die-attach paddle positioned within the ring shaped frame and coupled to the ring shaped outer frame by at least one interconnect. An integrated circuit die is mounted to the die-attach paddle. Wire bonds are coupled between the integrated circuit die and the leads. The integrated circuit die, wire bonds, and at least a portion of the lead frame are encapsulated. The ring shaped outer frame is removed. For example, the ring shaped outer frame may be removed when the QFN package is singulated. Removing the ring shaped outer frame forms electrically isolated pins from the leads, and separates the die-attach paddle.

In an aspect, forming the lead frame includes forming an extended lead of the plurality of leads to have a first portion and a second portion. The first portion extends from the inner edge towards the die-attach paddle. The second portion extends from the first portion to between the die-attach paddle and a second lead. The extended lead may optionally have an additional (e.g., third) portion and further portions.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 4 shows a flowchart providing an example process for assembling a QFN package having extended pins, according to an embodiment of the present invention.

Figure 1:
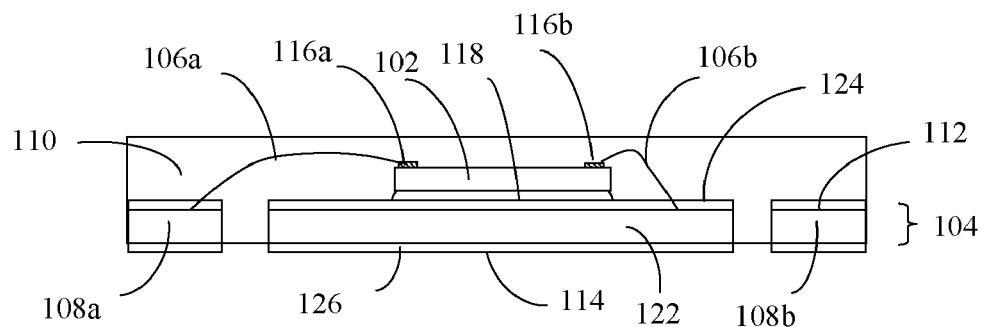
FIG. 1 shows a cross-sectional view of an example quad flat no-lead (QFN) package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Quad Flat Package Types

Figure 2:
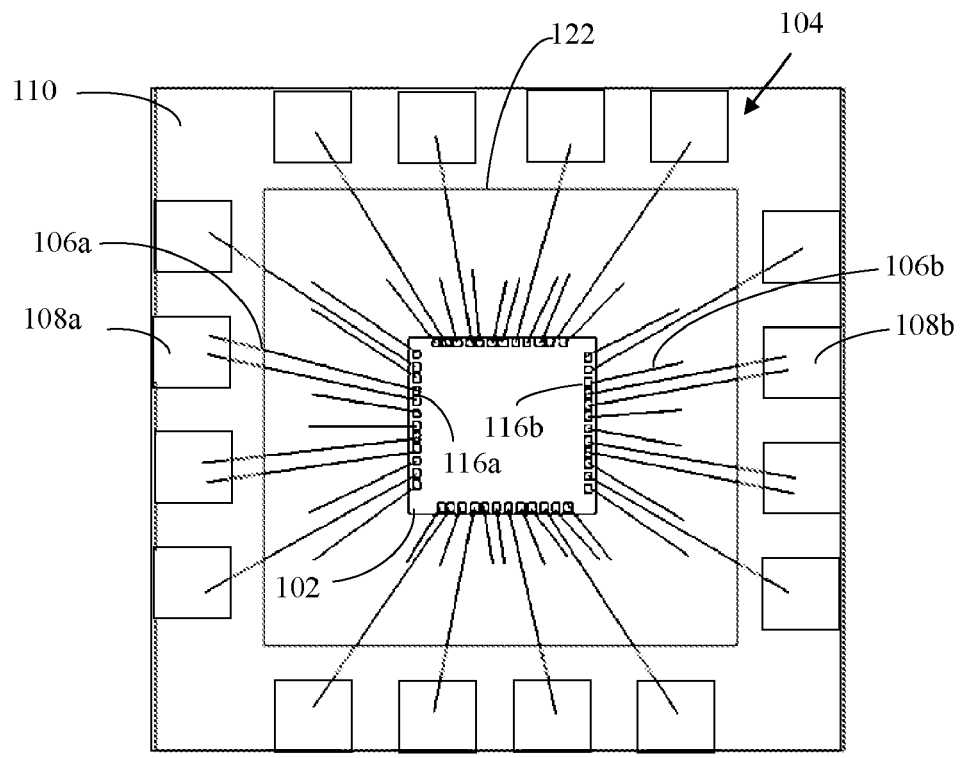
FIG. 2 shows a top view of the QFN package of FIG. 1.

Embodiments of the present invention relate to lead frame-based integrated circuit packages, such as quad flat no-lead (QFN) packages. Example QFN packages are described in this section for illustrative purposes. FIG. 1 shows a cross-sectional view of an example QFN package 100. FIG. 2 shows a top view of QFN package 100. QFN package 100 includes an integrated circuit die/chip 102, a lead frame portion 104, bond wires (also known as "wire bonds") 106, and an encapsulating material 110. Lead frame portion 104 includes a plurality of peripherally positioned pins 108 (including pins 108a and 108b indicated in FIGS. 1 and 2) and a die-attach paddle 122. Die-attach paddle 122 is positioned within an outer ring of QFN package 100 formed by pins 108. Lead frame portion 104 has a first (e.g., top) surface 112 that is opposed to a second (e.g., bottom) surface 114 of lead frame portion 104. Pins 108 at second surface 114 are lands/contacts for mounting QFN package 100 to a circuit board during a surface mount process.

Die 102 is integrated circuit chip/or die that includes a miniature electronic circuit formed of semiconductor devices. As shown in FIG. 1, die 102 is mounted to die-attach paddle 122 at first surface 112 of lead frame portion 104. Die 102 may be mounted to die-attach paddle 122 using an adhesive material 118. Adhesive material 118 may be any type of suitable adhesive material, including an epoxy, solder, glue, or other adhesive, which may be electrically conductive (e.g., a silver particle filled epoxy) or non-electrically conductive.

As shown in FIG. 1, a plurality of bond wires 106 are coupled between pads/terminals 116 of die 102 and first surface 112 of lead frame portion 104. For example, a first bond wire 106a is connected between a pad 116a and pin 108a of lead frame portion 104, and a second bond wire 106b is connected between a pad 116b and die-attach paddle 122 of lead frame portion 104. Any number of bond wires 106 may be present, depending on a number of signals (at pads 116) of die 102 to be coupled to lead frame portion 104. Bond wires 106 may be wires formed of any suitable electrically conductive material, including a metal such as gold, silver, copper, aluminum, nickel, tin, other metal, or combination of metals/alloy. Bond wires 106 may be attached according to wire bonding techniques and mechanisms well known to persons skilled in the relevant art(s).

As further shown in FIG. 1, encapsulating material 110 covers die 102 and bond wires 106 on first surface 112 of lead frame portion 104, and fills in regions between pins 108 and die-attach paddle 122 (encapsulating material 110 is shown as transparent in FIG. 2 for ease of illustration). Encapsulating material 110 protects die 102 and bond wires 106 from environmental hazards. Encapsulating material 110 may be any suitable type of encapsulating material, including an epoxy, a ceramic material, a plastic material, a mold compound, etc. Encapsulating material 110 may be applied in a variety of ways, including by a saw singulation technique, injection into a mold, etc.

Lead frame portion 104 may be made of an electrically conductive material, including a metal such as copper, aluminum, tin, nickel, gold, silver, or other metal, or a combination of metals/alloy, such as a solder, etc. First and second surfaces 112 and 114 of lead frame portion 104 may optionally be coated with an electrically conductive material and/or be otherwise surface treated. For example, as shown in FIG. 1, first surface 112 is coated with a first electrically conductive coating 124, and second surface is coated with a second electrically conductive coating 126 (electrically conductive coatings 124 and 126 are not shown in FIG. 2 for ease of illustration). Electrically conductive coatings 124 and 126 may be any suitable electrically conductive material, including a metal such as copper, aluminum, tin, nickel, gold, silver, or other metal, or a combination of metals/alloy, such as a solder, etc. Electrically conductive coatings 124 and 126 may be formed on lead frame portion 104 in any manner, including by a plating technique (e.g., electroplating), a printing technique, photolithography, or other technique.

QFN packages, such as QFN package 100, are undergoing rapid growth in industry due to their many benefits, such as small size, thin profile, low weight, and low cost. As products operate at increasingly higher speeds and require increasing amounts of power, a corresponding increase in the electrical and mechanical capabilities of QFN packages is required. For traditional QFN packages, each pin 108 can be wire bonded to a single die pad 116 or to two adjacent die pads 116. Thus, a total number of pads 116 of die 102 that may be coupled to power, ground, and I/O signals at pins 108 is limited by the total number of pins 108 on QFN package. This constraint on the number of power, ground, and I/O pads frequently means that a QFN package cannot meet the power/ground/signal ratio criteria required for a high speed device.

Embodiments of the present invention enable greater numbers of pads 116 (e.g., ground, power, and/or I/O signals) to be coupled to pins in a manner that is not limited by a total number of pins of the QFN package. Example embodiments are further described in the following section.

Example Embodiments

Embodiments of the present invention provide integrated circuit packages with enhanced characteristics. For example, in embodiments, a QFN package is enabled with increased ground signal, power, I/O signal connectivity. In conventional QFN packages (e.g., QFN package 100), each pin 108 may be wire bonded to one or two adjacent pads 116. In embodiments, a QFN package enables larger numbers of bond wires to be connected to a pin of the QFN package by providing an extended pin. As power, ground, and/or I/O terminals/pads are added to a die, the additional power, ground, and I/O terminals/pads may be wire bonded to one or more extended pins configured for the particular power, ground, or I/O signal. By coupling a larger number of wire bonds to extended pins, the bond wire inductance is reduced, providing more solid power, ground, and I/O connections. Furthermore, in embodiments, the extended pins may enable shorter bond wire connections with the die as compared to conventional pins. Still further, the already low cost of QFN packages is not increased.

The example embodiments described herein are provided for illustrative purposes, and are not limiting. Although described below with reference to QFN packages, the examples described herein may be adapted to other types of lead frame-based integrated circuit packages. Furthermore, additional structural and operational embodiments, including modifications/alterations, will become apparent to persons skilled in the relevant art(s) from the teachings herein.

Figure 3:
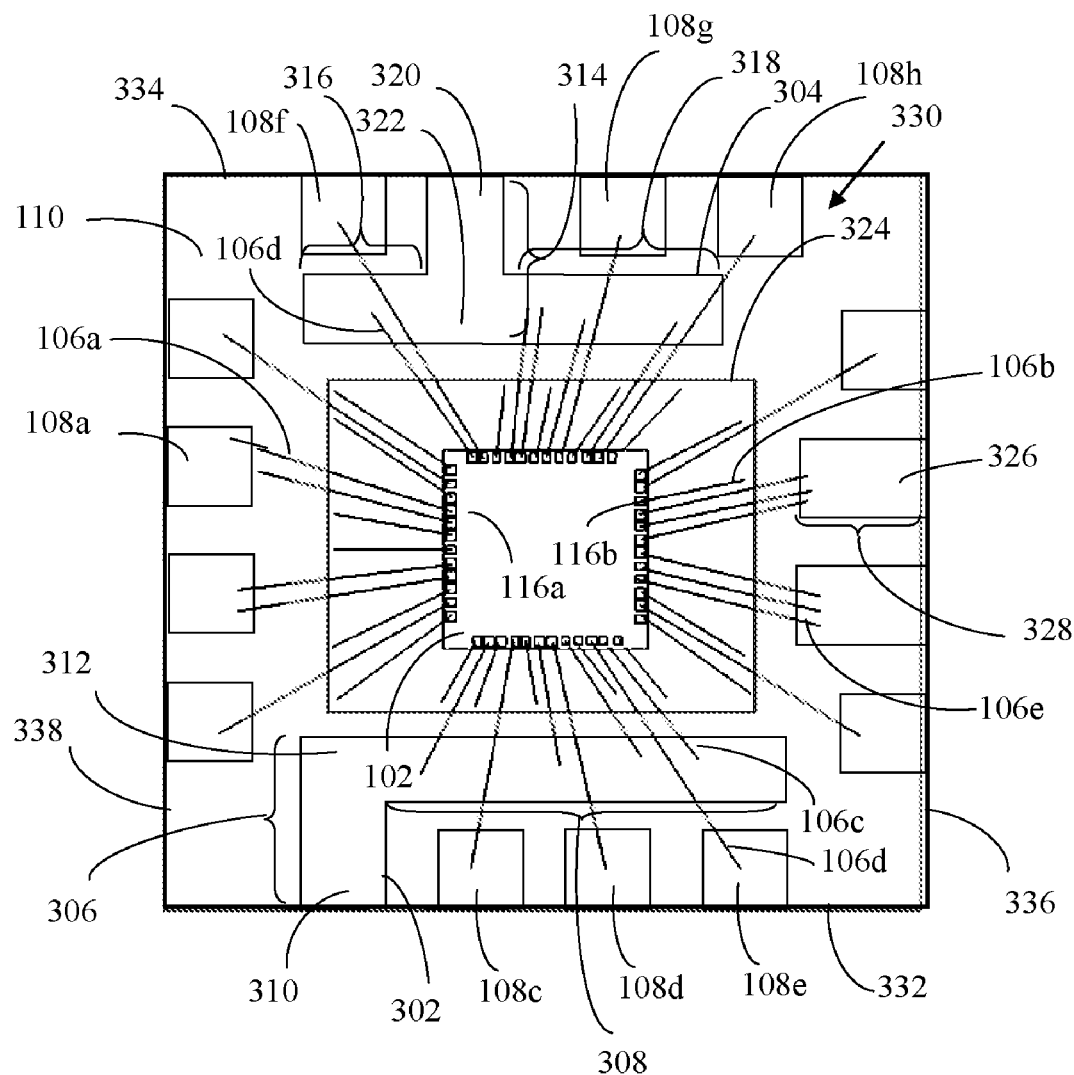
FIG. 3 shows a top view of a QFN package, according to an example embodiment of the present invention.

FIG. 3 shows a top view of a QFN package 300, according to an example embodiment of the present invention. QFN package 300 is described as follows. Some features of QFN package 300 having names/reference numbers similar to those described above with respect to FIGS. 2 and 3 are not re-described below for purposes of brevity. As shown in FIG. 3, QFN package 300 has four peripheral edges 332, 334, 336, and 338. QFN package 300 includes integrated circuit die/chip 102, a lead frame portion 330, bond wires 106, and encapsulating material 110. Lead frame portion 330 includes a die-attach paddle 324 and a plurality of peripherally positioned pins, including pins 108a, 108c-108e, 108f-108h, 302, 304, and 326. Die-attach paddle 324 is positioned within a ring formed by the pins. Lead frame portion 330 has a first (e.g., top) surface 112 that is opposed to a second (e.g., bottom) surface 114 of lead frame portion 330, similarly to lead frame 104 shown in FIG. 1.

Pins 302, 304, and 326 are extended pins, having a length/size that is greater than conventional pins, such as pin 108a. For example, pins 302, 304, and 326 may have one or more dimensions that are greater than comparable dimensions of non-extended pins 108. The extension of pins 302, 304, and 326 enables additional bond wire connections. Furthermore, the extension of pins 302, 304, and 326 enables shorter bond wire connections with the die 102 of QFN package 300.

For example, pin 302 is generally L-shaped. As shown in FIG. 3, pin 302 has a first portion 306 that extends from peripheral edge 332 of package 300 towards die-attach paddle 324. First portion 306 has a first end 310 at edge 332 and a second end 312 closer to die-attach paddle 324. Pin 302 further has a second portion 308 that extends from end 312 of first portion 306 (at a right angle) to between die-attach paddle 324 and pins 108c-108e located along edge 332. As shown in FIG. 3, four bond wires are coupled between pads of die 102 and pin 302, including a bond wire 106c. As shown in FIG. 3, bond wire 106c is a shorter bond wire than is required for conventional bond wire configurations (such as bond wire 106a). Additional bond wires that cross over pin 302 are coupled between pads of die 102 and pins 108c-108e, including a bond wire 106d.

Pin 304 is generally T-shaped. As shown in FIG. 3, pin 304 has a first portion 314 that extends from peripheral edge 334 of QFN package 300 towards die-attach paddle 324. First portion 314 has a first end 320 at edge 334 and a second end 322 that extends toward die-attach paddle 324. Pin 304 further has a second portion 316 that extends from end 322 of first portion 314 (at a right angle) to between die-attach paddle 324 and pin 108f located along edge 334. Pin 304 further has a third portion 318 that extends from end 322 (in an opposite direction from second portion 316, in the current example) between die-attach paddle 324 and pins 108g and 108h located along edge 334. As shown in FIG. 3, five bond wires are coupled between pads of die 102 and pin 304, including a bond wire 106d. As shown in FIG. 3, bond wire 106d is a shorter bond wire than is required for conventional bond wire configurations. Additional bond wires that cross over pin 304 are coupled between pads of die 102 and pins 108f-108h.

Pin 326 has an elongated rectangular shape. Pin 326 extends a distance 326 inwardly from edge 336 of QFN package 300, which is a greater distance than pins 108 extend inward. In this manner, shorter bond wires are enabled to be coupled between pads of die 102 and pin 326, such as a bond wire 106e. Furthermore, because pin 326 extends closer to die 102 than pins 108, additional numbers of bond wires 106 may be connected to pin 326 (e.g., due to the enabled increased radial spread across the end of pin 326). For example, as shown in FIG. 3, three bond wires, including bond wire 106e, are connected between pads of die 102 and pin 326. Furthermore, bond wire 106e is a shorter bond wire than is required for conventional bond wire configurations.

As described above, extended pins, such as pins 302, 304, and 328 shown in FIG. 3, provide connections for more bond wires 106 than conventional pins 108. In the example of FIG. 3, four bond wires 106 are connected to pin 302, five wire bonds 106 are connected to pin 304, and three bond wires 106 are connected to pin 326. The numbers of bond wires shown connected to pins 302, 304, and 326 in FIG. 3 are provided for purposes of illustration, and are not intended to be limiting. Other numbers of bond wires may be coupled with pins 302, 304, and 326, including numbers of bond wires greater than 3 or 4. For instance, numbers of bond wires greater than 5 bond wires, greater than 10 bond wires, and greater than 20 bond wires may be connected between pads 116 of die 102 and an extended pin, in example embodiments. Such connections are enabled without preventing other bond wires 106 being coupled between pads 116 of die 102 and pins 108, because those wire bonds can cross over an extended pin (e.g., such as bond wire 106d crossing over pin 302), if needed.

Furthermore, as shown in FIG. 3, bond wires connected between die 102 and extended pins 302, 304, and 326 may be shorter than is required in conventional bond wire configurations, due to the closer proximity of extended pins 302, 304, and 326 to die 102 relative to conventional pins 108. For example, as described above, bond wires 106c, 106d, and 106e are shorter than conventional bond wire 106a. A shorter bond wire length enables a lower bond wire inductance. Furthermore, shorter bond wires are less likely to short with their neighbors.

Note that in an embodiment, die-attach paddle 324 of QFN package 300 may have a smaller area than die attach paddle 122 in QFN package 100 of FIG. 1, for similarly sized packages. The smaller area enables extended pins, such as pins 302 and 304, to extend between pins 108 and die 102.

A QFN package with extended pins, such as QFN package 300, may be formed in any manner, including according to conventional package assembly processes or according to proprietary assembly processes. FIG. 4 shows a flowchart 400 providing an example process for assembling a QFN package having extended pins, according to an embodiment of the present invention. Other structural and operational embodiments will be apparent to persons skilled in the relevant art(s) based on the discussion regarding flowchart 400. Note that some conventional steps for assembling a QFN package may not shown in FIG. 4 for purposes of brevity. Such conventional steps will be known to persons skilled in the relevant art(s). Flowchart 400 is described as follows.

Figure 5:
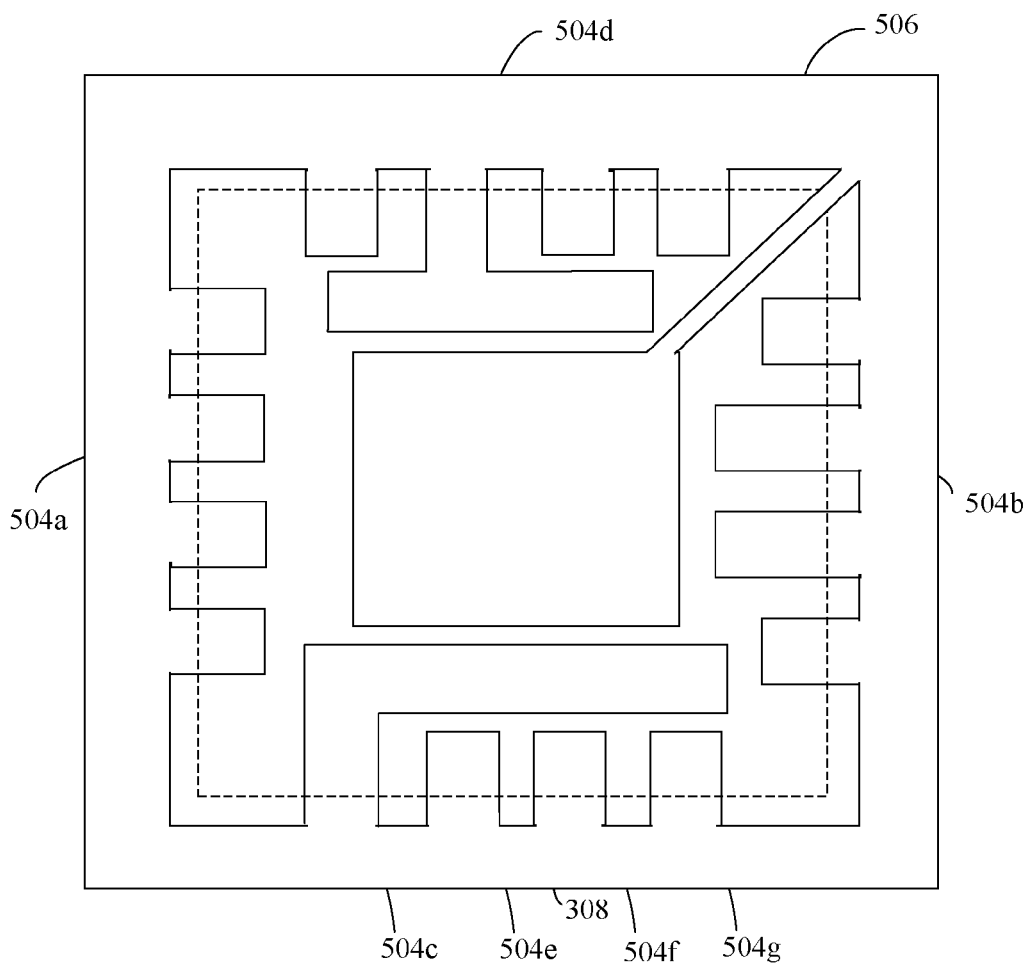
FIG. 5 shows a lead frame having extended leads, according to an example embodiment of the present invention.

Flowchart 400 begins with step 402. In step 402, a lead frame is formed having a ring shaped outer frame, a plurality of leads extending inwardly from an inner edge of the ring shaped outer frame, and a die-attach paddle. For example, FIG. 5 shows a lead frame 500, according to an example embodiment of the present invention. As shown in FIG. 5, lead frame 500 includes a rectangular ring shaped outer frame 506 (e.g., the portion of lead frame 500 outside of the dotted line rectangle in FIG. 5), a plurality of leads 504 (including leads 504a-504h) extending inwardly from an inner edge 508 of outer frame 506, and die-attach paddle 324.

Die-attach paddle 324 is positioned within outer frame 506, and is coupled to outer frame 506 at inner edge 508 by an interconnect 502. Any number of interconnects 502 may be used to couple die-attach paddle 324 to outer frame 506. Such interconnects 502 may be corner located, as shown for interconnect 502 in FIG. 5, and/or may be located elsewhere along inner edge 508 of outer frame 506. Although die-attach paddle 324 is shown as having a rectangular shape in FIG. 5, die-attach paddle 324 may have an alternative shape, including round, elliptical, other polygon, or irregular.

Lead frame 500 may be formed according to any suitable process, including by a conventional lead frame fabrication process, or by a proprietary process. For example, in an embodiment, lead frame 500 may be formed by receiving a foil or sheet of an electrically conductive material, and etching, cutting, or otherwise forming leads 504, die-attach paddle 324, interconnect 502, and/or other features in the foil or sheet. Such etching or cutting may be performed using chemical etching, photolithography, laser etching, mechanical etching, a punching mechanism, or other suitable process. Alternatively, lead frame 500 may be formed by injecting an electrically conductive material into a mold chamber. Lead frame 500 may be made of any suitable electrically conductive material, including a metal such as copper, aluminum, tin, nickel, gold, silver, or other metal, or combination of metals/alloy, or any other suitable electrically conductive material, as would be known to persons skilled in the relevant art(s). Note that lead frame 500 may be formed individually, or may be formed in a strip of lead frames 500 or a panel (e.g., array) of lead frames 500, to be used to form multiple QFN packages. The strip or panel may be separated into individual lead frames 500 prior to performing further steps of flowchart 400, at any point during flowchart 400, or during step 410 of flowchart 400 described below, for example.

As shown in FIG. 5, lead frame 500 forms a base frame for lead frame portion 330 of QFN package 300. In a subsequent processing step (described below), outer frame 506 may be removed from lead frame 500 to provide isolated pins and a die-attach paddle for a QFN package. When outer frame 506 is removed from lead frame 500, leads 504 become electrically isolated to form respective pins (e.g., pins 108, 302, 304, and 326). In an embodiment, lead frame 500 may be formed to have extended leads, which form extended pins when outer frame 506 is removed from lead frame 500. For example, as shown in FIG. 5, lead 504a is a conventional lead, and leads 504b-504d are extended leads (corresponding to pins 108, 326, 302, and 304).

Figure 6:
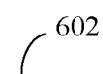
FIG. 6 shows a process for forming an extended lead, according to an example embodiment of the present invention.

In an embodiment, step 402 of flowchart 400 may include a step 602 shown in FIG. 6, where an example extended lead is formed. In step 602, a first lead is formed to have a first portion that extends from the inner edge towards the die-attach paddle and a second portion that extends from an end of the first portion between the die-attach paddle and a second lead. For instance, leads 504c and 504d shown in FIG. 5 may be formed according to step 602. With respect to lead 504c (which is L shaped), as shown in FIG. 5, lead 504c may be formed such that first portion 306 extends from inner edge 508 towards die-attach paddle 324, and such that second portion 308 extends from end 312 to between die-attach paddle 324 and leads 504e-504g. With respect to lead 504d (which is T shaped), lead 504d may be formed such that first portion 314 extends from inner edge 508 towards die-attach paddle 324, and second portion 316 extends from end 322 between die-attach paddle 324 and lead 504h (furthermore, third portion 318 is formed to extend from end 322 between die-attach paddle 324 and two further leads).

In step 404, an integrated circuit die is mounted to the die-attach paddle. For example, in an embodiment, die 102 may be attached to die attach paddle 324 of lead frame 500. Die 102 may be attached to die attach paddle 324 in any manner, such as by adhesive material 118 shown in FIG. 1 and described above. Die 102 may be placed on die-attach paddle 324 using a pick-and-place machine, or any other suitable mechanism otherwise known to persons skilled in the relevant art(s). Die 102 may be mounted to any portion of die attach paddle 324, including a central location (e.g., the center) or an off center location.

In step 406, at least one wire bond is attached between the integrated circuit die and at least one lead of the plurality of leads. For example, in an embodiment, bond wires 106 shown in FIG. 3 may be attached between pads 116 of die 102 and leads 504. Bond wires 106 may be attached in any manner, including by a conventional wire bonding machine, or by other technique mentioned elsewhere herein or otherwise known, as would be known to persons skilled in the relevant art(s). Bond wires 106 may be made of any suitable electrically conductive material, including a metal such as copper, aluminum, tin, nickel, gold, silver, or other metal, or combination of metals/alloy, or any other suitable electrically conductive material, as would be known to persons skilled in the relevant art(s).

In step 408, the integrated circuit die and at least a portion of the lead frame are encapsulated. For example, in an embodiment, encapsulating material 110 shown in FIG. 3 may be applied to cover die 102 and bond wires 106 on lead frame 500, and to fill in regions between leads 504 and die-attach paddle 324 within inner edge 504. Encapsulating material 110 may be applied in any manner, including by injection into a mold, or by other technique mentioned elsewhere herein or otherwise known, as would be known to persons skilled in the relevant art(s).

In step 410, the ring shaped outer frame is removed. As described above, lead frame 500 shown in FIG. 5 may form a base frame for lead frame portion 330 of QFN package 300 in FIG. 3. Outer frame 506 may be removed from lead frame 500 to create and isolate pins 108, 302, 304, and 326 from lead frame 500. Furthermore, removing outer frame 506 from lead frame 500 isolates die-attach paddle 324 by disconnecting an end of interconnect 502. Interconnect 502 may remain in a QFN package or may be removed, as desired (interconnect 502 is not shown in QFN package 300 in FIG. 3, for ease of illustration). Outer frame 506 may be removed from lead frame 500 (e.g., at the dotted line rectangle shown in FIG. 5) in any manner, including by a conventional package singulation technique. Example techniques include a saw singulation technique, laser cutting, a stamping process, or any other suitable technique mentioned elsewhere herein or otherwise known.

Figure 7:
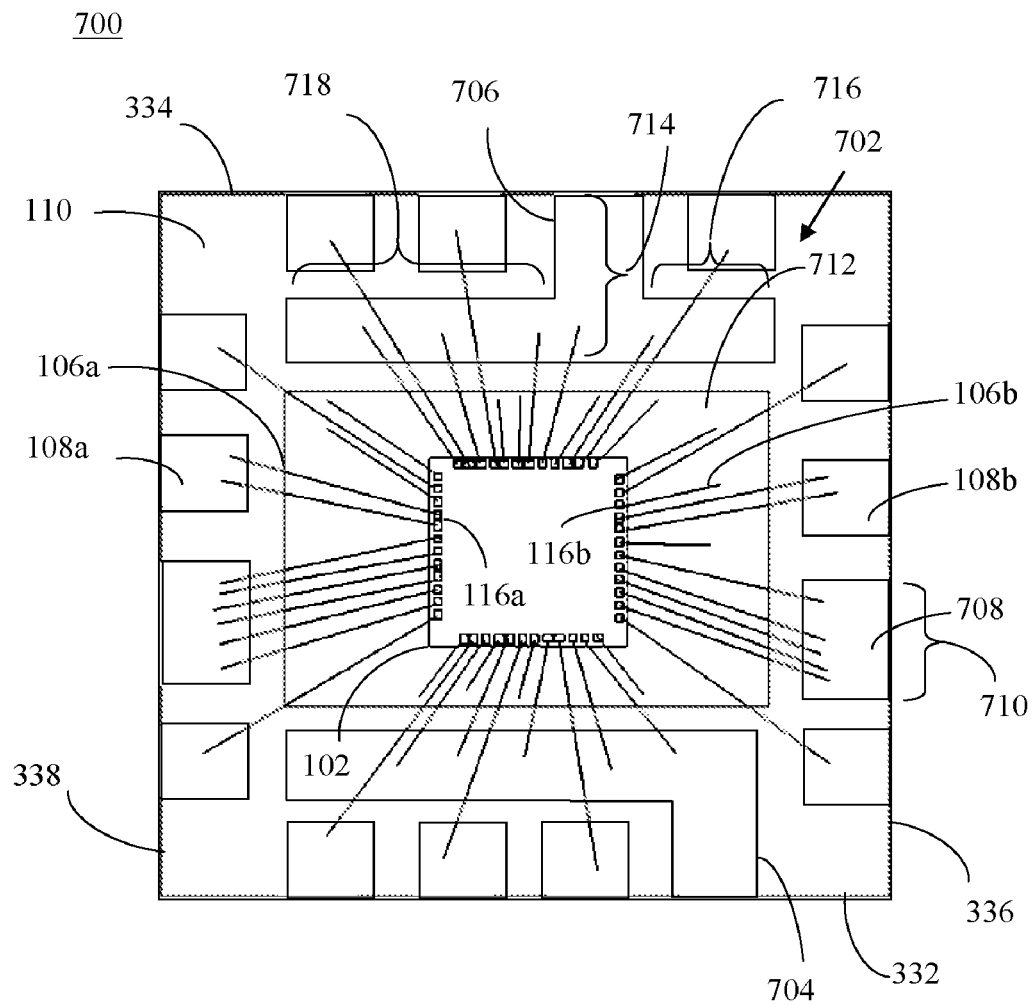
FIGS. 7-10 show example QFN packages, according to embodiments of the present invention.

QFN package 300 may be formed according to flowchart 400 of FIG. 4 (and step 602 of FIG. 6), as well as further QFN package embodiments of the present invention. For instance, FIGS. 7-10 show further example QFN packages, according to embodiments of the present invention, which may be assembled according to flowchart 400 (and step 602). FIG. 7 shows a top view of a QFN package 700, according to an example embodiment of the present invention. QFN package 700 is similar to QFN package 300 shown in FIG. 3, with differences described as follows. As shown in FIG. 7, QFN package 700 includes integrated circuit die/chip 102, a lead frame portion 702, bond wires 106, and encapsulating material 110. Lead frame portion 702 includes a die-attach paddle 712 and a plurality of peripherally positioned pins, including pins 108 (e.g., pins 108a and 108b), 704, 706, and 708. Die-attach paddle 712 is positioned within a ring formed by the pins.

As shown in FIG. 7, pins 704, 706, and 708 are extended pins. Pin 704 is a generally L shaped pin similar to pin 302 of FIG. 3. Pin 704 is a mirror image of pin 302 shown in FIG. 3, extending from edge 332 at a right-most pin position, rather than from a left most pin position (as for pin 302 in FIG. 3).

Pin 706 is a T shaped pin similar to pin 304 shown in FIG. 3. Pin 706 is a mirror image of pin 304 shown in FIG. 3, extending from edge 334 at a second pin position from the right, rather than from a second pin position from the left (as for pin 304 in FIG. 3). Pin 706 includes first, second, and third portions 714, 716, and 718, corresponding to first, second, and third portions 314, 316, and 318 of pin 304. Note that third portion 718 is longer than third portion 318 shown in FIG. 3, extending from first portion 714 to a point flush with an edge of die attach paddle 712.

Pin 708 has an elongated rectangular shape. Pin 708 extends along edge 336 of QFN package 700 a distance 710, which is a greater distance than pins 108 extend along their respective edges of package 700. In this manner, greater numbers of bond wires 106 may be connected to pin 708 as compared to pins 108. For example, as shown in FIG. 7, five bond wires are connected between pads of die 102 and pin 708. Because pin 708 extends along edge 336 rather than extending inwardly towards die attach paddle 712, die attach paddle 712 may have a width (in an axis perpendicular to edge 336) that is greater than a width of die attach paddle 324 in FIG. 3 (which is shortened due to extended pin 326, which extends towards die attach paddle 324).

Figure 8:
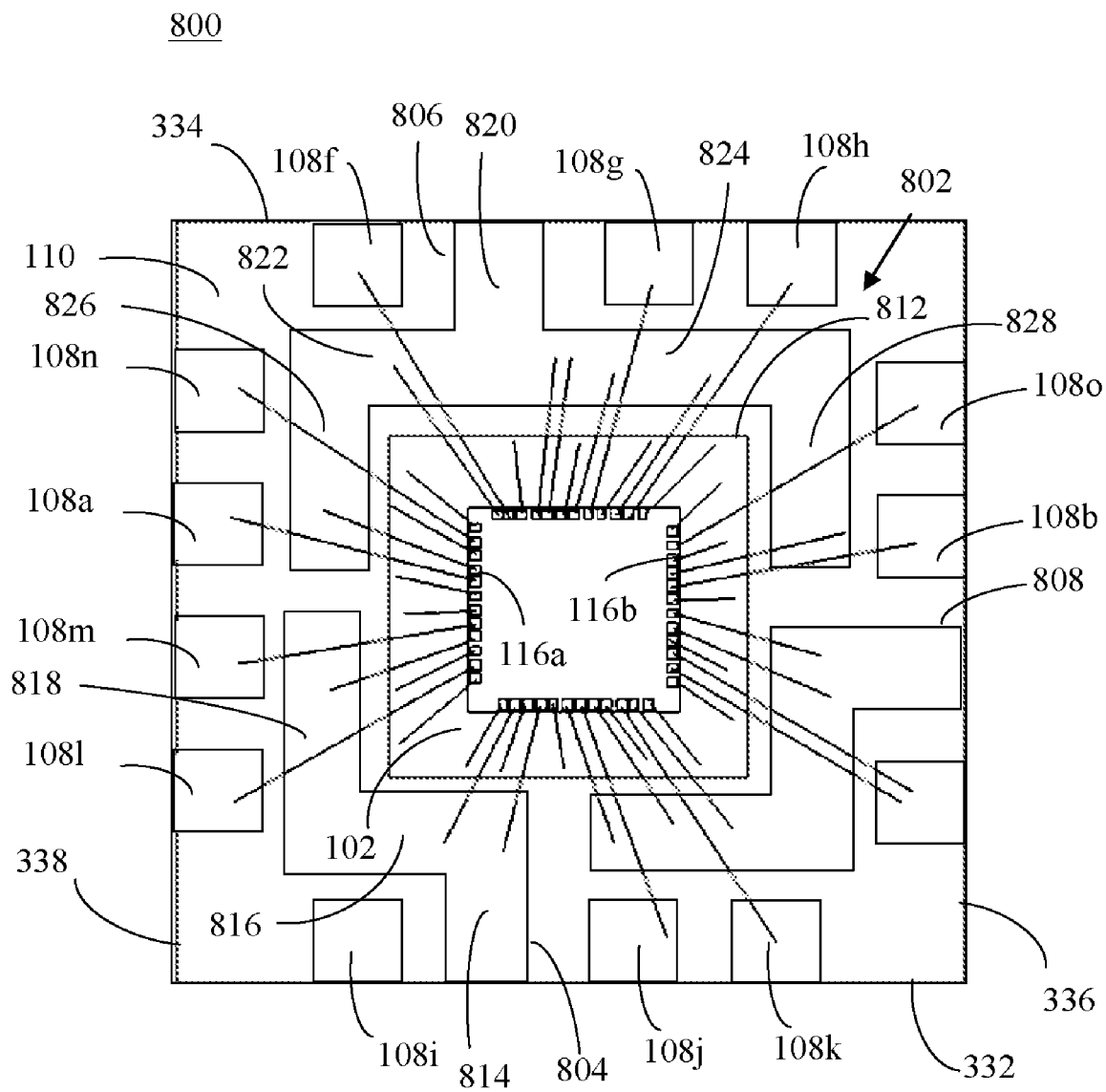

FIG. 8 shows a top view of a QFN package 800, according to another example embodiment of the present invention. QFN package 800 is similar to QFN package 300 shown in FIG. 3, with differences described as follows. As shown in FIG. 8, QFN package 800 includes integrated circuit die/chip 102, a lead frame portion 802, bond wires 106, and encapsulating material 110. Lead frame portion 802 includes a die-attach paddle 812 and a plurality of peripherally positioned pins, including pins 108 (e.g., pins 108a and 108b), 804, 806, and 808. Die-attach paddle 812 is positioned within a ring formed by the pins.

As shown in FIG. 8, pins 804, 806, and 808 are extended pins. Pins 804 and 808 are generally zig-zag shaped pins. Pin 804 has a first portion 814 that extends from edge 332 towards die-attach paddle 812. Pin 804 further has a second portion 816 that extends from an end of first portion 814 (at a right angle) between die-attach paddle 812 and a pin 108i located along edge 332. Pin 804 further has a third portion 818 that extends from an end of second portion 816 (at a right angle, parallel to first portion 814) to form a bend around a corner of die attach paddle 812, to a location between die-attach paddle 812 and pins 108l and 108m located along edge 338. As shown in FIG. 8, three bond wires are coupled between pads of die 102 and pin 804. The three bond wires may be shorter than conventional bond wires due to the proximity of pin 804 to die 102. Additional bond wires are coupled between pads of die 102 and pins 108l and 108m that cross over pin 804. Pin 808 is configured similarly to pin 804, extending from edge 336, having three portions, and forming a bend around a second corner of die attach paddle 812.

Pin 806 is a generally "wishbone" shaped pin. Pin 806 has a first portion 820 that extends from edge 334 towards die-attach paddle 812. Pin 806 further has a second portion 822 that extends from an end of first portion 820 (at a right angle) to between die-attach paddle 812 and pin 108f located along edge 334. Pin 806 further has a third portion 824 that extends from the end of first portion 820 (in an opposite direction from second portion 822, in the current example) to between die-attach paddle 812 and pins 108g and 108h located along edge 334. Pin 806 further has a fourth portion 826 that extends from an end of second portion 822 (at a right angle) to bend around a corner of die attach paddle 812, to a location between die-attach paddle 812 and pins 108n and 108a located along edge 338. Pin 806 further has a fifth portion 828 that extends from an end of third portion 824 (at a right angle) to bend around a corner of die attach paddle 812, to a location between die-attach paddle 812 and pin 108o located along edge 336. As shown in FIG. 8, seven bond wires are coupled between pads of die 102 and pin 806. The seven bond wires may be shorter than conventional bond wires due to the proximity of pin 806 to die 102. Additional bond wires that cross over pin 806 are coupled between pads of die 102 and pins 108a, 108b, 108f-108h, 108n, and 108o.

Figure 9:
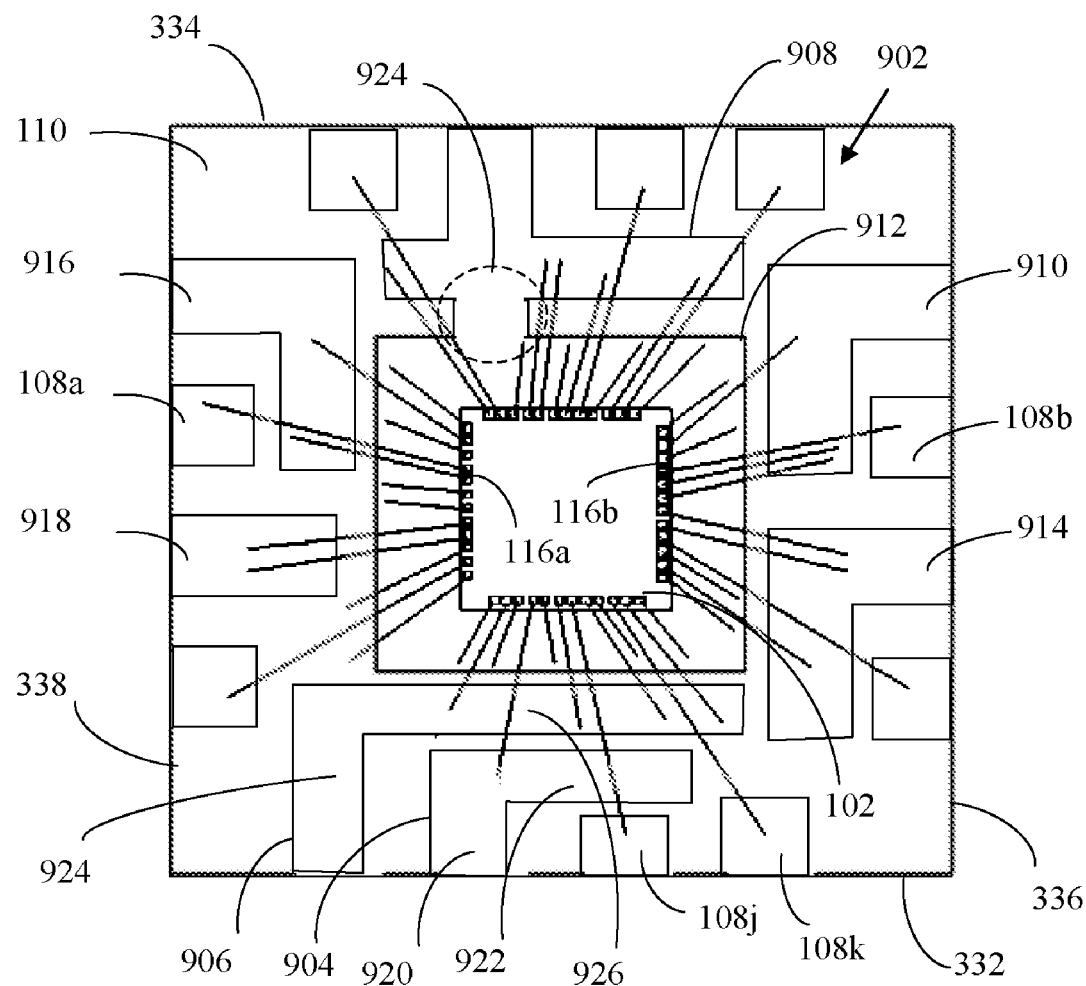

FIG. 9 shows a top view of a QFN package 900, according to an example embodiment of the present invention. QFN package 900 is similar to QFN package 300 shown in FIG. 3, with differences described as follows. As shown in FIG. 9, QFN package 900 includes integrated circuit die/chip 102, a lead frame portion 902, bond wires 106, and encapsulating material 110. Lead frame portion 902 includes a die-attach paddle 912 and a plurality of peripherally positioned pins, including pins 108 (e.g., pins 108a and 108b), 904, 906, 908, 910, 914, 916, and 918. Die-attach paddle 912 is positioned within a ring formed by the pins.

As shown in FIG. 9, pins 904, 906, 908, 910, 914, 916, and 918 are extended pins. Pins 904, 906, 910, 914, and 916 are generally L shaped pins similar to pin 302 of FIG. 3. Pin 908 is a generally T shaped pin similar to pin 304 shown in FIG. 3.

In embodiments, any number of extended pins may be positioned along any edge of a QFN package. For example, as shown in FIG. 9, extended pins 904 and 906 are positioned along edge 332, extended pins 910 and 914 are positioned along edge 336, and extended pins 916 and 918 are positioned along edge 338.

In an embodiment, an extended pin may be electrically isolated from a die-attach paddle of the QFN package. For instance, in the example of FIG. 9, pins 904, 906, 910, 914, 916, and 918 are electrically isolated from die-attach paddle 912. In another embodiment, an extended pin may be coupled to the die-attach paddle of the QFN package. For example, as shown in FIG. 9, pin 908 is coupled to die-attach paddle 912 by an interconnect 924 (shown circled by a dotted line in FIG. 9). Interconnect 924 may be formed during step 602 shown in FIG. 6, for example. Interconnect 924 may have any width, length, and/or shape, as desired for a particular implementation.

In another embodiment, two or more extended pins may interlock, and/or be positioned in parallel between pins and a die attach paddle of a QFN package. For example, as shown in FIG. 9, extended pins 904 and 906 extend in parallel between pin 108j and die-attach paddle 912. Pin 904 has a first portion 920 that extends from peripheral edge 332 towards die-attach paddle 912 and a second portion that extends from first portion 920 to a position between die-attach paddle 912 and pin 108j. Pin 906 has a first portion 924 that extends from peripheral edge 332 towards die-attach paddle 912 and a second portion 926 that extends from first portion 924 between die-attach paddle 912 and second portion 922 of pin 904.

Note that FIGS. 3 and 7-9 show packages having sixteen pins, for ease of illustration. It is noted, however, that embodiments of the present invention are applicable to packages having any number of pins. Embodiments are applicable to QFN packages having 3, 20, 32, and 68 pins, for instance.

Figure 10:
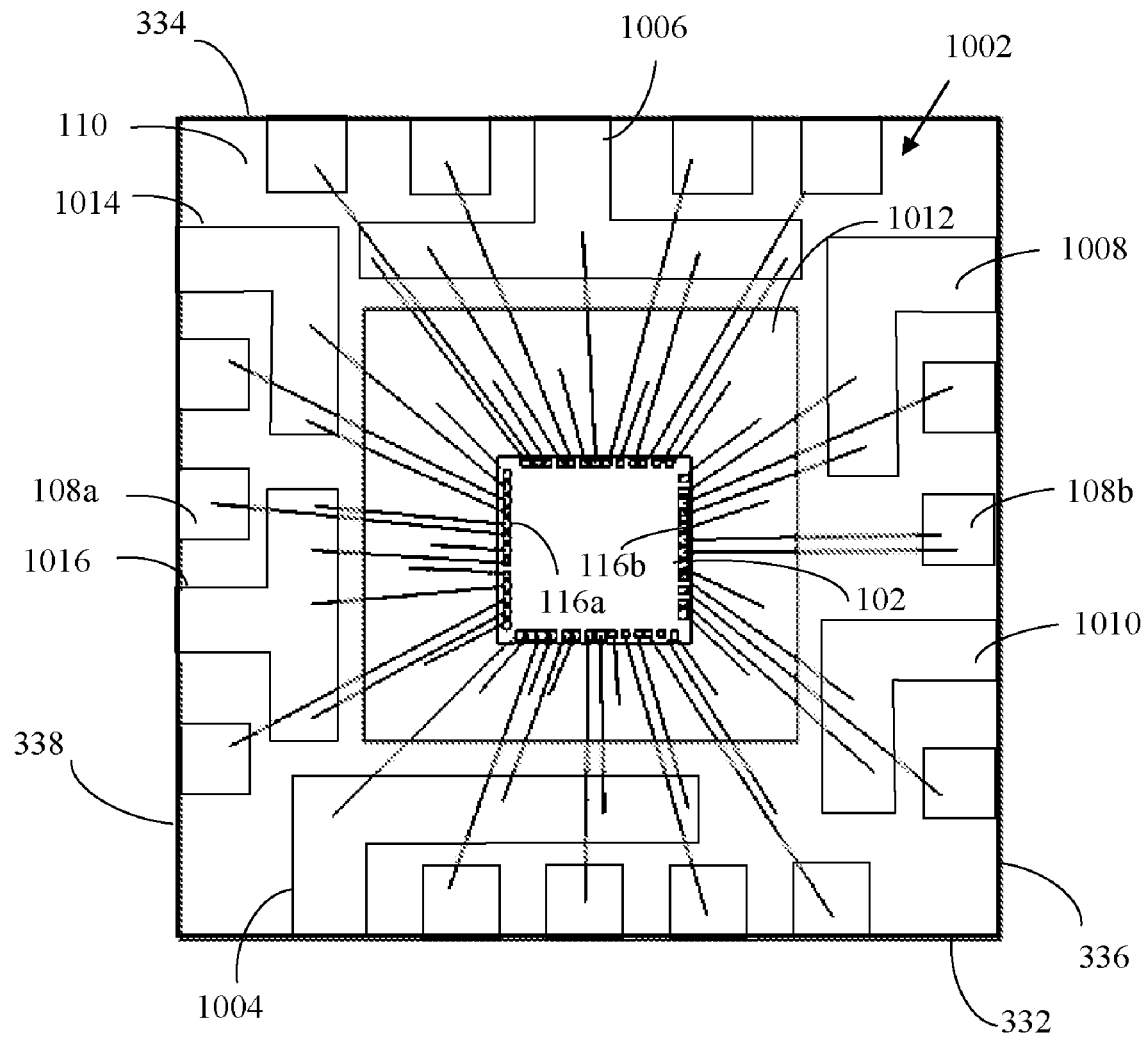

FIG. 10 shows a top view of a QFN package 1000, according to an example embodiment of the present invention. As shown in FIG. 10, QFN package 1000 has twenty pins. QFN package 1000 is similar to QFN package 300 shown in FIG. 3. As shown in FIG. 10, QFN package 1000 includes integrated circuit die/chip 102, a lead frame portion 1002, bond wires 106, and encapsulating material 110. Lead frame portion 1002 includes a die-attach paddle 1012 and a plurality of peripherally positioned pins, including pins 108 (e.g., pins 108a and 108b), 1004, 1006, 1008, 1010, 1014, and 1016. Die-attach paddle 1012 is positioned within a ring formed by the pins.

As shown in FIG. 10, pins 1004, 1006, 1008, 1010, 1014, and 1016 are extended pins. Pins 1004, 1006, 1008, 1010, and 1014 are generally L shaped pins similar to pin 302 of FIG. 3. Pin 1006 is a generally T shaped pin similar to pin 304 shown in FIG. 3.

CONCLUSION

Embodiments are described herein having various shapes, sizes, numbers, and combinations of extended leads (in a lead frame) and pins (in a package). Embodiments of the present invention may include any number and combination of shapes of the extended leads/pins described herein, and any variations/modifications thereof.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A quad flat no-lead (QFN) package, comprising:
a plurality of peripherally positioned pins;
a die-attach paddle positioned within a ring formed by the plurality of peripherally positioned pins;
an integrated circuit die attached to the die-attach paddle; and
an encapsulating material that encapsulates the integrated circuit die on the die-attach paddle and at least a portion of the plurality of peripherally positioned pins;
wherein a first pin of the plurality of peripherally positioned pins has a first portion that extends from a peripheral edge towards the die-attach paddle and a second portion that extends from an end of the first portion to between the die-attach paddle and a second pin of the plurality of peripherally positioned pins; and
wherein the first pin is electrically isolated from the die-attach paddle.

2. The QFN package of claim 1, wherein the first pin is L-shaped.

3. The QFN package of claim 1, wherein the first pin further has a third portion that extends from the end of the first portion to between the die-attach paddle and a fifth pin of the a plurality of peripherally positioned pins.

4. The QFN package of claim 3, wherein the first pin is T-shaped.

5. The QFN package of claim 1, wherein the first pin further has a third portion that extends from the second portion around a corner of the die-attach paddle.

6. A quad flat no-lead (QFN) package, comprising:
a plurality of peripherally positioned pins;
a die-attach paddle positioned within a ring formed by the plurality of peripherally positioned pins;
an integrated circuit die attached to the die-attach paddle; and
an encapsulating material that encapsulates the integrated circuit die on the die-attach paddle and at least a portion of the plurality of peripherally positioned pins;
wherein a first pin of the plurality of peripherally positioned pins has a first portion that extends from a peripheral edge towards the die-attach paddle and a second portion that extends from an end of the first portion to between the die-attach paddle and a second pin of the plurality of peripherally positioned pins; and
wherein the first pin is coupled to the die-attach paddle.

7. A quad flat no-lead (QFN) package, comprising:
a plurality of peripherally positioned pins;
a die-attach paddle positioned within a ring formed by the plurality of peripherally positioned pins;
an integrated circuit die attached to the die-attach paddle;
a bond wire; and
an encapsulating material that encapsulates the integrated circuit die on the die-attach paddle and at least a portion of the plurality of peripherally positioned pins;
wherein a first pin of the plurality of peripherally positioned pins has a first portion that extends from a peripheral edge towards the die-attach paddle and a second portion that extends from an end of the first portion to between the die-attach paddle and a second pin of the plurality of peripherally positioned pins; and
wherein the bond wire is coupled between a pad of the die and the first pin.

8. A quad flat no-lead (QFN) package, comprising:
a plurality of peripherally positioned pins;
a die-attach paddle positioned within a ring formed by the plurality of peripherally positioned pins;
an integrated circuit die attached to the die-attach paddle; and
an encapsulating material that encapsulates the integrated circuit die on the die-attach paddle and at least a portion of the plurality of peripherally positioned pins;
wherein a first pin of the plurality of peripherally positioned pins has a first portion that extends from a peripheral edge towards the die-attach paddle and a second portion that extends from an end of the first portion to between the die-attach paddle and a second pin of the plurality of peripherally positioned pins; and
wherein a third pin of the plurality of peripherally positioned pins has a first portion that extends from the peripheral edge towards the die-attach paddle and a second portion that extends from an end of the first portion of the third pin to between the die-attach paddle and the second portion of the first pin of the plurality of peripherally positioned pins.

9. A lead frame for an integrated circuit package, comprising:
- a ring shaped outer frame;
- a plurality of leads extending inwardly from an inner edge of the ring shaped outer frame; and
- a die-attach paddle positioned within the ring shaped frame and coupled to the ring shaped frame by at least one interconnect;
- wherein a first lead of the plurality of leads has a first portion that extends from the inner edge towards the die-attach paddle and a second portion that extends from an end of the first portion to between the die-attach paddle and a second lead of the plurality of leads; and
- wherein the first lead is electrically isolated from the die-attach paddle when separated from the ring shaped outer frame.

10. The lead frame of claim 9, wherein the first lead is L-shaped.

11. The lead frame of claim 9, wherein the first lead further has a third portion that extends from the end of the first portion to between the die-attach paddle and a fifth lead of the plurality of leads.

12. The lead frame of claim 11, wherein the first lead is T-shaped.

13. The lead frame of claim 9, wherein the first lead further has a third portion that extends from the second portion around a corner of the die-attach paddle.

14. A lead frame for an integrated circuit package, comprising:
- a ring shaped outer frame;
- a plurality of leads extending inwardly from an inner edge of the ring shaped outer frame; and
- a die-attach paddle positioned within the ring shaped frame and coupled to the ring shaped frame by at least one interconnect;
- wherein a first lead of the plurality of leads has a first portion that extends from the inner edge towards the die-attach paddle and a second portion that extends from an end of the first portion to between the die-attach paddle and a second lead of the plurality of leads; and
- wherein the first lead is coupled to the die-attach paddle.

15. A lead frame for an integrated circuit package, comprising:
- a ring shaped outer frame;
- a plurality of leads extending inwardly from an inner edge of the ring shaped outer frame; and
- a die-attach paddle positioned within the ring shaped frame and coupled to the ring shaped frame by at least one interconnect;
- wherein a first lead of the plurality of leads has a first portion that extends from the inner edge towards the die-attach paddle and a second portion that extends from an end of the first portion to between the die-attach paddle and a second lead of the plurality of leads; and
- wherein a third lead of the plurality of leads has a first portion that extends from the peripheral edge towards the die-attach paddle and a second portion that extends from an end of the first portion of the third lead to between the die-attach paddle and the second portion of the first lead of the plurality of leads.

16. A quad flat no-lead (QFN) package, comprising:
- a plurality of peripherally positioned pins;
- a die-attach paddle positioned within a ring formed by the plurality of peripherally positioned pins;
- an integrated circuit die attached to the die-attach paddle; and
- an encapsulating material that encapsulates the integrated circuit die on the die-attach paddle and at least a portion of the plurality of peripherally positioned pins;
- wherein a first pin of the plurality of peripherally positioned pins has a first portion that extends from a peripheral edge towards the die-attach paddle and a second portion that extends from an end of the first portion to between the die-attach paddle and a second pin of the plurality of peripherally positioned pins; and
- wherein a third pin of the plurality of peripherally positioned pins has a width along the peripheral edge that is greater than a width of a fourth pin of the plurality of peripherally positioned pins along the peripheral edge.

17. The QFN package of claim 16, further comprising:
- a first plurality of bond wires coupled between the die and the third pin; and
- a second plurality of bond wires coupled between the die and the fourth pin;
- wherein the first plurality of bond wires includes a greater number of bond wires than the second plurality of bond wires.

18. A lead frame for an integrated circuit package, comprising:
- a ring shaped outer frame;
- a plurality of leads extending inwardly from an inner edge of the ring shaped outer frame; and
- a die-attach paddle positioned within the ring shaped frame and coupled to the ring shaped frame by at least one interconnect;
- wherein a first lead of the plurality of leads has a first portion that extends from the inner edge towards the die-attach paddle and a second portion that extends from an end of the first portion to between the die-attach paddle and a second lead of the plurality of leads; and
- wherein a third lead of the plurality of leads has a width along the inner edge that is greater than a width of a fourth lead of the plurality of leads along the inner edge.

* * * * *